(12) United States Patent
Orsini et al.

(10) Patent No.: US 6,744,851 B2
(45) Date of Patent: Jun. 1, 2004

(54) LINEAR FILAMENT ARRAY SHEET FOR EUV PRODUCTION

(75) Inventors: Rocco A. Orsini, Long Beach, CA (US); Michael B. Petach, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 35 days.

(21) Appl. No.: 10/159,765

(22) Filed: May 31, 2002

(65) Prior Publication Data

US 2003/0223543 A1 Dec. 4, 2003

(51) Int. Cl.[7] .................................................. G21G 4/00
(52) U.S. Cl. ..................................... 378/119; 250/504 R
(58) Field of Search ................................. 378/119, 143; 250/504 R

(56) References Cited

U.S. PATENT DOCUMENTS

| | | | | |
|---|---|---|---|---|
| 4,953,191 A | * | 8/1990 | Smither et al. | 378/143 |
| 5,577,091 A | * | 11/1996 | Richardson et al. | 378/119 |
| 6,002,744 A | | 12/1999 | Hertz et al. | 378/119 |
| 6,307,913 B1 | * | 10/2001 | Foster et al. | 378/34 |
| 6,339,634 B1 | | 1/2002 | Kandaka et al. | |
| 6,493,423 B1 | * | 12/2002 | Bisschops | 378/119 |
| 6,507,641 B1 | * | 1/2003 | Sugisaki et al. | 378/119 |
| 2002/0044629 A1 | | 4/2002 | Hertz et al. | |

OTHER PUBLICATIONS

Hansson B A M et al., "A Liquid–Xenon–Jet Laser–Plasma X–ray and EUV Source", Microeletric Engineering, Elsevier Publishers BV., Amsterdam, NL, vol. 53, No. 1–4, Jun. 2000, pp. 667–670.

Hansson, Bjorn A.M.; Rymell, Lars; Berglund, Magnus; Hemberg, Oscar; Janin, Emmanuelle; Mosesson, Sofia and Thoresen, Jalmar; "A Liquid–Xenon–Jet Laser–Plasma Source for EUV Lithography", 3rd International Workshop on EUV Lithography, 2001, 5 pps.

Rymell, L.; Berglund, M; Hansson, B.A.M.; and Hertz, H.M.; "X–Ray and EUV Laser–Plasma Sources Based on Cryogenic Liquid–Jet Target"; Biomedical and X–Ray Physics, Royal Institute of Technology, SE–10044 Stockholm, Sweden; Part of the SPIE Conference on Emerging Lithograph Technologies III, Santa Clara, California, Mar. 1999; pps. 421–432.

Klebniczki, J; Hebling, J.; Hopp, B.; Hajos, G. and Bor, Z.; "Fluid Jet with Variable Thickness in the range 5–20 mu m"; Meas. Sci. Technol. 5 (May 1994) 601–603.

* cited by examiner

Primary Examiner—Craig E. Church
Assistant Examiner—Jurie Yun
(74) Attorney, Agent, or Firm—John A. Miller; Warn, Burgess & Hoffmann, P.C.

(57) ABSTRACT

An EUV radiation source (12) that generates a sheet (36) of a liquid target material that has a width that matches the desired laser spot size (28) for good conversion efficiency and a thickness that matches the laser beam/target interaction depth. The EUV source (12) includes a reservoir (10) containing a pressurized cryogenic liquid target material, such as liquid Xenon. The reservoir (10) also includes an array (14) of closely spaced orifices (16). The liquid target material is forced through the orifices (16) into a vacuum chamber as separated liquid stream filaments (20) of the target material that define the sheet (36). The liquid streams freeze to form an array of frozen target filaments (20). A laser beam (24) is directed to a target area (28) in the vacuum chamber where it irradiates the stream of filaments (20) to create a plasma (30) that emits EUV radiation (32).

20 Claims, 3 Drawing Sheets

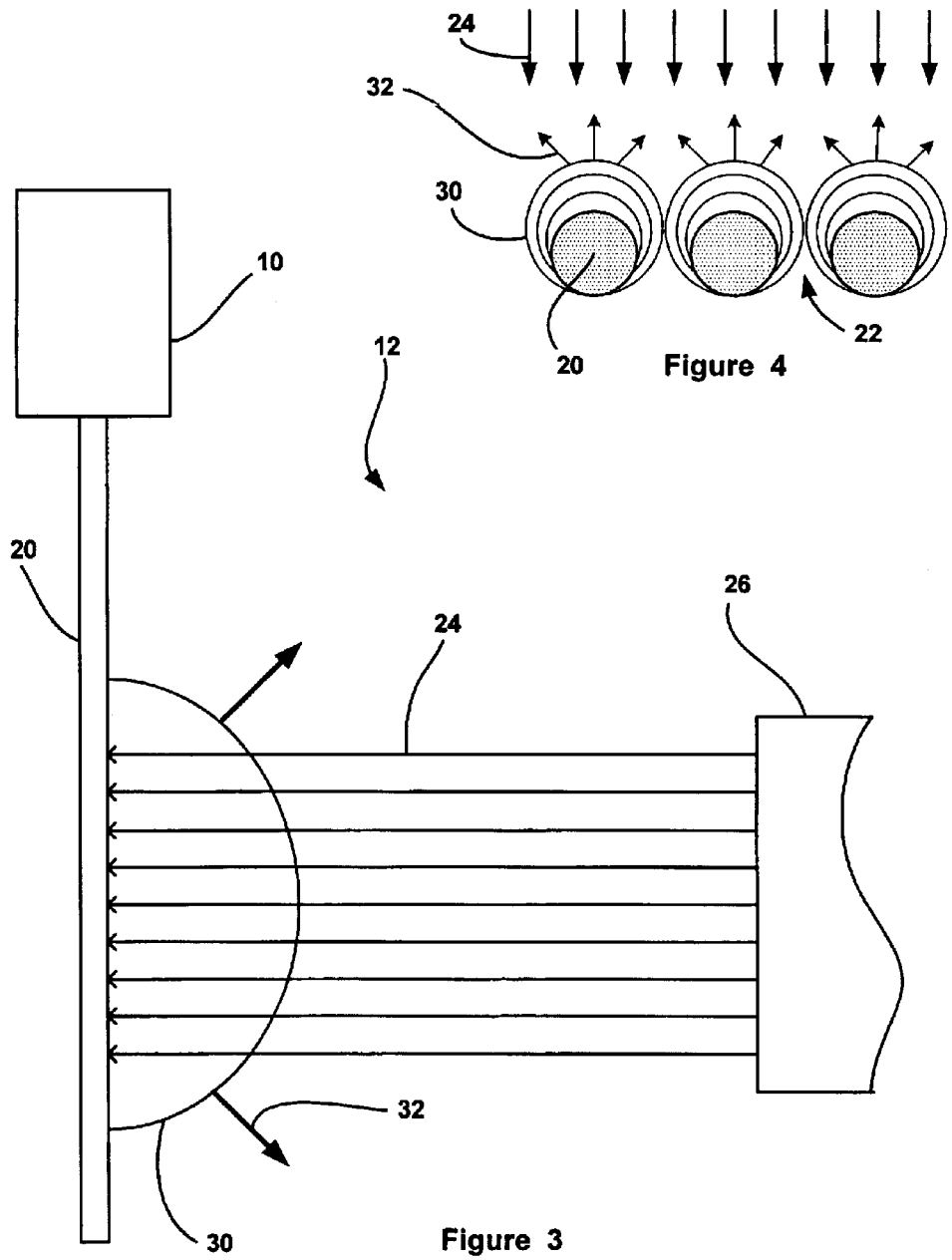

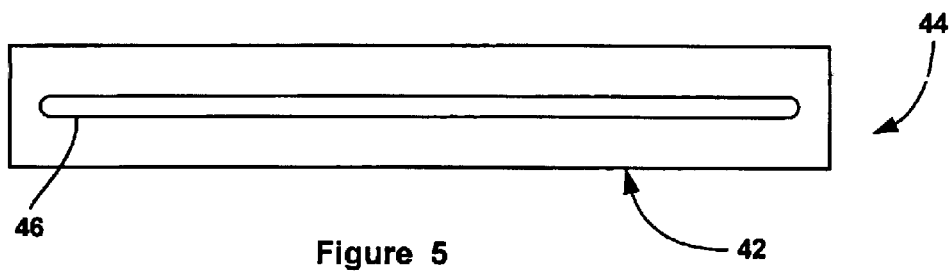
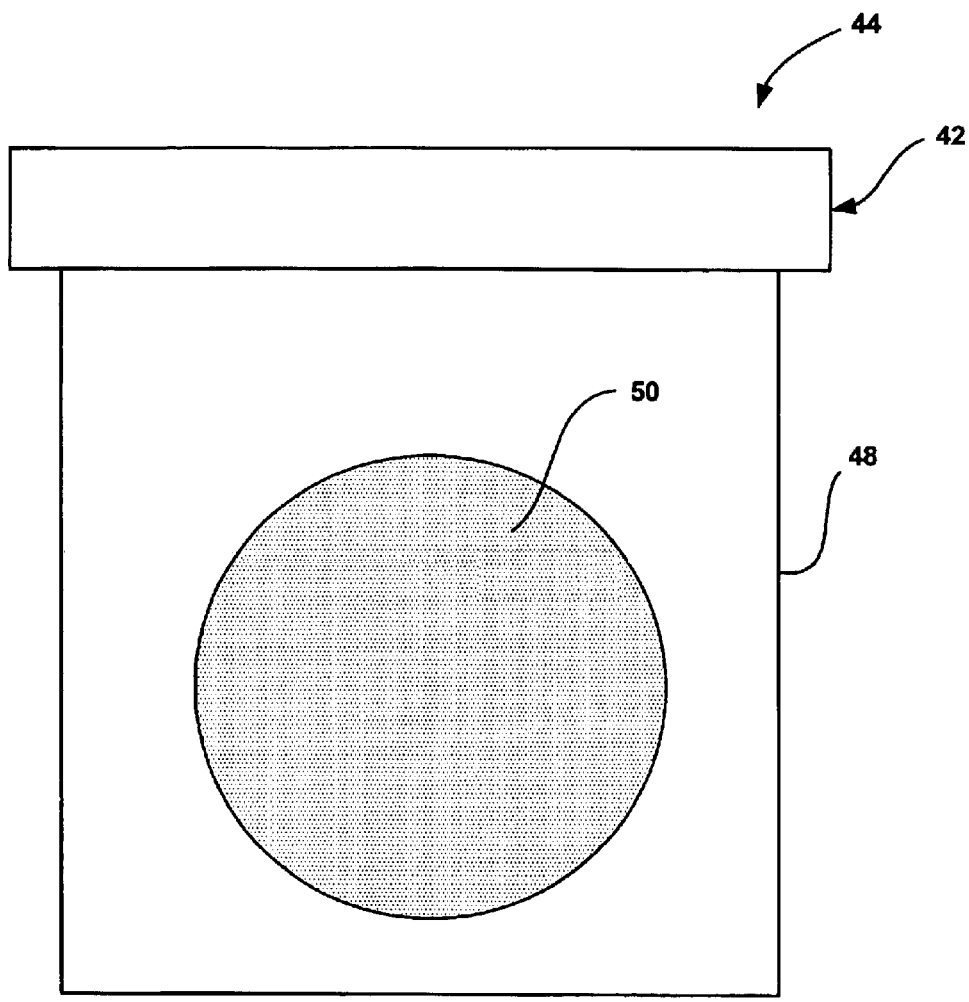

LINEAR FILAMENT ARRAY SHEET FOR EUV PRODUCTION

BACKGROUND OF THE INVENTION

1. Field of the Invention

This invention relates generally to a laser-plasma extreme ultraviolet (EUV) radiation source and, more particularly, to a laser-plasma EUV radiation source that generates a thin sheet of a cryogenic target material or a linear array of closely spaced filaments of a cryogenic target material, where the sheet or the array of filaments has a width that corresponds to a laser spot size providing a desired conversion efficiency and a thickness that corresponds to a laser/target interaction depth.

2. Discussion of the Related Art

Microelectronic integrated circuits are typically patterned on a substrate by a photolithography process, well known to those skilled in the art, where the circuit elements are defined by a light beam propagating through a mask. As the state of the art of the photolithography process and integrated circuit architecture becomes more developed, the circuit elements become smaller and more closely spaced together. As the circuit elements become smaller, it is necessary to employ photolithography light sources that generate light beams having shorter wavelengths and higher frequencies. In other words, the resolution of the photolithography process increases as the wavelength of the light source decreases to allow smaller integrated circuit elements to be defined. The current trend for photolithography light sources is to develop a system that generates light in the extreme ultraviolet (EUV) or soft X-ray wavelengths (13–14 nm).

Various devices are known in the art to generate EUV radiation. One of the most popular EUV radiation sources is a laser-plasma, gas condensation source that uses a gas, typically Xenon, as a laser plasma target material. Other gases, such as Krypton, and combinations of gases, are also known for the laser target material. In the known EUV radiation sources based on laser produced plasmas (LPP), the gas is typically cryogenically cooled to a liquid state, and then forced through a nozzle into a vacuum chamber as a continuous liquid stream or filament. The lowered temperature of the liquid target material and the vapor pressure within the vacuum environment cause the target material to quickly freeze. Cryogenically cooled target materials, which are gases at room temperature, are required because they do not condense on the EUV optics, and because they produce minimal by-products that have to be evacuated by the vacuum chamber. In some designs, the nozzle is agitated so that the target material is emitted from the nozzle as a stream of liquid droplets having a certain diameter (50–100 $\mu$m) and a predetermined droplet spacing. Some designs employ sheets of frozen cryogenic material on a rotating substrate, but this is impractical for production EUV sources because of debris and repetition rate limitations.

The target stream is illuminated by a high-power laser beam, typically from an Nd:YAG laser, that heats the target material to produce a high temperature plasma which radiates the EUV radiation. The laser beam is delivered to a target area as laser pulses having a desirable frequency. The laser beam must have a certain intensity at the target area in order to provide enough heat to generate the plasma.

It is desirable that a EUV source has a good conversion efficiency. Conversion efficiency is the measure of the laser beam energy that is converted into recoverable EUV radiation. It has been shown that to provide a good conversion efficiency, the laser beam spot size at the target area must be larger in diameter than the distance the plasma expands during each laser beam pulse. Further, the target size must be larger than the laser spot size in order for the target to intercept all of the laser energy. For targets that are droplets or cylindrical filaments, the desired laser spot size that provides good conversion efficiency is orders of magnitude larger than the depth that the laser beam enters into and interacts with the target material (5–10 $\mu$m deep) to generate the plasma. Therefore, as the size of the droplet or filament is increased, more of the target material is unused or unvaporized because of the limits of the laser interaction depth into the droplet or filament.

EUV radiation must be produced in a vacuum chamber. The remaining target material is pumped out of the chamber in its gas phase after it has been exposed to the laser beam. Thus, it is not practical to simply increase the diameter of the droplet or filament to the laser spot size that provides the desired conversion efficiency because of the system mass flow constraints. For example, for a target droplet of 500 $\mu$m and a laser pulse of 750 mJ, only 0.2% of the mass of the droplet is used for making the EUV radiation, and the remaining 99.8% of the mass of the droplet is left over as debris that must be evacuated from the chamber. The vacuum pumps of the system set the practical upper limit for the total mass flow of cryogenic target material into the chamber.

SUMMARY OF THE INVENTION

In accordance with the teachings of the present invention, an EUV radiation source is disclosed that generates a flowing sheet or a linear array of filaments of a liquid target material that have a width that matches the desired laser spot size for good conversion efficiency and a thickness that matches the laser beam/target interaction depth. In one embodiment, the EUV source includes a reservoir containing a source of a pressurized cryogenic liquid target material, such as liquid Xenon. The reservoir also includes an array of closely spaced orifices. The liquid target material is forced through the orifices into a vacuum chamber as closely spaced liquid stream filaments of the target material. The liquid streams freeze to form an array of frozen target filaments. A laser beam is directed to a target area in the vacuum chamber where it irradiates the sheet of filaments. The width of the laser beam at the target area covers most of the width of the array of filaments to provide a high conversion efficiency. In an alternate embodiment, the orifices are replaced with an elongated slot that generates a frozen sheet of target material having a desired width and thickness.

Additional objects, advantages and features of the present invention will become apparent from the following description and appended claims, taken in conjunction with the accompanying drawings.

BRIEF DESCRIPTION OF THE DRAWINGS

FIG. 3 is a side view of the EUV radiation source and target filaments shown in FIG. 2;

FIG. 4 is a cross-sectional view of a few of the filaments of the EUV radiation source shown in FIG. 2 generating a plasma;

FIG. 5 is a front view of an EUV radiation source employing a target material slot, according to another embodiment of the present invention; and FIG. 6 is a top view of the EUV radiation source shown in FIG. 5 emitting a sheet of a cryogenic target material.

DETAILED DESCRIPTION OF THE EMBODIMENTS

The following discussion of the embodiments of the invention directed to an EUV radiation source is merely exemplary in nature, and is in no way intended to limit the invention or its applications or uses.

Figure 1:
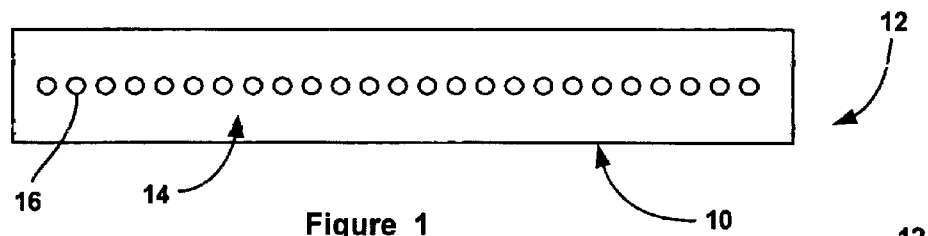
FIG. 1 is a front view of an EUV radiation source having a linear array of target material orifices, according to an embodiment of the present invention.

FIG. 1 is a front view of a target material reservoir 10 associated with an LPP EUV radiation source 12. Other parts of the source 12, such as the EUV collection optics, target laser, focusing optics, etc., are not shown in this figure because they are not necessary for a proper understanding of the invention. As will be appreciated by those skilled in the art, these various other parts of the source 12 can be any device suitable for an EUV source of the type discussed herein. The reservoir 10 contains a suitable cryogenically cooled EUV target material, such as liquid Xenon, under a suitable pressure. As with the various parts of the source 12, the components within the reservoir 10, such as a condensor, filter, etc., can be any devices suitable for the purposes discussed herein.

Figure 2:
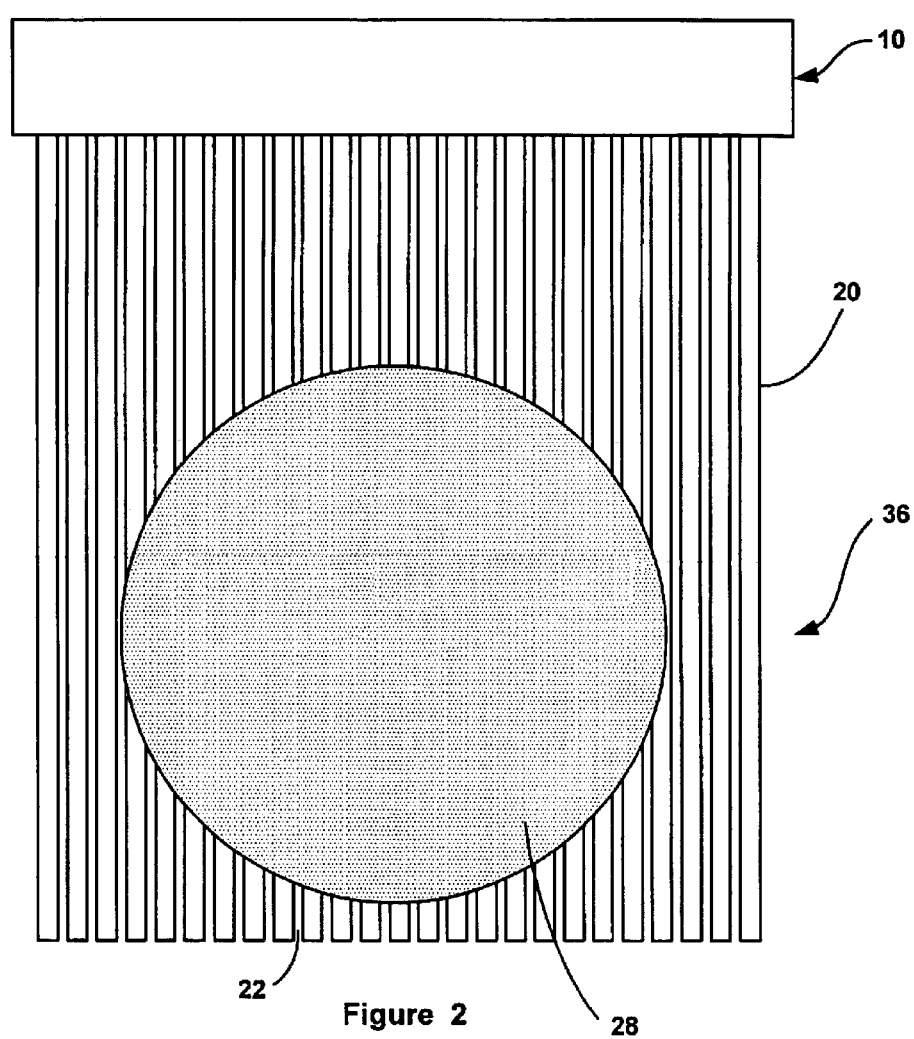
FIG. 2 is a top view of the EUV radiation source shown in FIG. 1 emitting a sheet of target filaments.

The reservoir 10 includes a linear array 14 of closely spaced orifices 16 arranged in a row, as shown. The liquid target material within the reservoir 10 is emitted from the orifices 16 as closely spaced cylindrical target filaments 20 into a vacuum chamber associated with EUV source 12. FIG. 2 is a top view and FIG. 3 is a side view of the source 12 showing the filaments 20 being emitted from the reservoir 10. The filaments 20 maintain their separation in the chamber to define gaps 22 therebetween. FIG. 3 shows the filaments 20 being irradiated by a laser beam 24 from a laser 26 at a target area 28 to generate a plasma 30 that emits EUV radiation 32. The target area 28 represents the laser spot size. The EUV radiation 32 is collected by collector optics (not shown) to be focussed for photolithography purposes or the like. Because the target material is cryogenically cooled and is emitted into a vacuum environment, the liquid target material quickly freezes to become an array of closely spaced frozen filaments before the filaments 20 reach the target area 28 and are irradiated by the laser beam 24 to form the plasma that generates the EUV radiation 32.

Because the filaments 20 combine to effectively provide a thin sheet 36 of the target material, the spot size of the laser beam 24 at the target area 28 can be increased over the laser beam spot sizes employed in EUV radiation sources known in the art. Further, the orifices 16 can be made very small in diameter so that the diameter of the filaments 20 is optimized to the interaction depth of the laser beam 24. Therefore, less unvaporized target material is left over as by-products that need to be evacuated from the vacuum chamber by the vacuum system of the source 12.

In one embodiment, there are twenty-five orifices 16 each having a diameter of 10 $\mu$m, where the space between the orifices 16 is 10 $\mu$m. However, it is stressed that this is by way of a non-limiting example in that other dimensions may be equally suitable for other designs and applications. The sheet 36 is therefore about 500 $\mu$m wide and about 10 $\mu$m thick. The laser beam 24 is cylindrical and has a diameter of about 300 $\mu$m. Therefore, a significant portion of the width of the sheet 36 is irradiated by the laser beam 24. The spot size of the laser beam 24 is made less than the width of the sheet 36 to allow for variations in the pointing direction of the laser beam 24 as a result of environmental perturbations and the like.

FIG. 4 is a cross-sectional view of three of the filaments 20 in the target area 28 being irradiated by the laser beam 24. As the laser beam 24 heats the filaments 20, the plasma 30 generated therefrom begins to expand from the filaments 20, as shown, and fill the gaps 22 between the filaments 20. Thus, little of the laser beam energy is lost through the gaps 22.

Providing a linear array of cylindrical filaments as the target material in an EUV source has been shown to be effective to allow the laser beam spot size to be increased at the target area, and thus increase the conversion efficiency of the EUV generation without adversely effecting the ability to remove the by-products from the vacuum chamber. In an alternate embodiment, the array 14 of the orifices 16 can be replaced with a slot to achieve the same, or nearly the same, results. FIG. 5 is a front view and FIG. 6 is a top view of a reservoir 42 associated with an EUV radiation source 44, according to another embodiment of the present invention. As is apparent, the array 14 of orifices 16 has been replaced with a thin elongated slot 46. The slot 46 generates a frozen sheet 48 of the target material at a target area 50 that is irradiated by a laser beam in the manner as discussed above. In an alternate embodiment, the slot 46 can be replaced with a nozzle or dispersion tip having the dimensions consistent with the discussion herein.

In this embodiment, the sheet 48 does not have gaps that the laser beam can propagate through. However, more target material is produced that may need to be evacuated from the chamber as unused by-products. The slot 46 can be 10 $\mu$m thick and 500 $\mu$m long to provide the same size sheet as the sheet 36. Other dimensions for the slot 46 can also be provided within the scope of the present invention.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. An extreme ultraviolet (EUV) radiation source for generating EUV radiation, said source comprising:
   a reservoir containing a target material under pressure, said reservoir including an array of closely spaced orifices, said reservoir emitting the target material through the orifices to provide a plurality of separate filament streams of the target material; and
   a laser source emitting a laser beam, said laser beam impinging at least some of the filament streams at a target area to create a plasma that emits the EUV radiation.

2. The source according to claim 1 wherein the target material is liquid Xenon.

3. The source according to claim 1 wherein the reservoir emits the filament streams into a vacuum chamber, and wherein the filament streams are liquid streams that freeze prior to reaching the target area.

4. The source according to claim 1 wherein the plurality of orifices is 25 orifices.

5. The source according to claim 1 wherein the orifices are round and the filament streams are cylindrical.

6. The source according to claim 5 wherein each orifice is about 10 $\mu$m in diameter and is spaced from an adjacent orifice by about 10 $\mu$m.

7. An extreme ultraviolet (EUV) radiation source for generating EUV radiation, said source comprising:
- a reservoir containing a target material under pressure, said reservoir including an elongated slot, said reservoir emitting the target material through the slot to provide a thin sheet of the target material; and
- a laser source emitting a laser beam, said laser beam irradiating the target material sheet at a target area to create a plasma that emits the EUV radiation.

8. The source according to claim 7 wherein the target material is liquid Xenon.

9. The source according to claim 7 wherein the reservoir emits the sheet of the target material into a vacuum chamber, and wherein the sheet of the target material is a liquid sheet that freezes prior to reaching the target area.

10. The source according to claim 7 wherein the slot is about 500 $\mu$m long and about 10 $\mu$m wide.

11. A method of generating extreme ultraviolet (EUV) radiation, said method comprising:
- cryogenically cooling a target material;
- emitting the target material into a vacuum chamber through an elongated slot that provides a thin sheet of the target material; and
- irradiating the thin sheet of the target material at a target area with a laser beam to create a plasma that emits the EUV radiation.

12. The method according to claim 11 wherein the slot is about 500 $\mu$m long and is about 10 $\mu$m wide.

13. The method according to claim 11 wherein emitting the target material into a vacuum chamber includes emitting the thin sheet of the target material as a liquid sheet that freezes prior to reaching the target area.

14. The method according to claim 11 wherein emitting the target material into a vacuum chamber includes emitting a Xenon target material into the vacuum chamber.

15. A method of generating extreme ultraviolet (EUV) radiation, said method comprising:
- cryogenically cooling a target material;
- emitting the target material into a vacuum chamber through an array of orifices to provide a plurality of separate filament streams of the target material; and
- irradiating the filament streams at a target area with a laser beam to create a plasma that emits the EUV radiation.

16. The method according to claim 15 wherein the array of spaced orifices is a plurality of circular orifices, said orifices emitting the target material as a plurality of separate cylindrical filament streams.

17. The method according to claim 16 wherein the orifices are about 10 $\mu$m in diameter and are spaced from each other by about 10 $\mu$m.

18. The method according to claim 16 wherein there are about 25 orifices.

19. The method according to claim 15 wherein emitting the target material into a vacuum chamber includes emitting the filament streams as liquid streams that freeze prior to reaching the target area.

20. The method according to claim 15 wherein emitting the target material into a vacuum chamber includes emitting a Xenon target material into the vacuum chamber.

* * * * *